United States Patent
Parthasarathy et al.

(10) Patent No.: US 7,540,919 B2
(45) Date of Patent: Jun. 2, 2009

(54) SOLIDIFICATION OF CRYSTALLINE SILICON FROM REUSABLE CRUCIBLE MOLDS

(75) Inventors: Santhana Raghavan Parthasarathy, Nashua, NH (US); Yuepeng Wan, Nashua, NH (US); Carl Chartier, Manchester, NH (US); Jonathan A Talbott, Amherst, NH (US); Kedar P Gupta, Hollis, NH (US)

(73) Assignee: GT Solar Incorporated, Merrimack, NH (US)

(*) Notice: Subject to any disclaimer, the term of this patent is extended or adjusted under 35 U.S.C. 154(b) by 498 days.

(21) Appl. No.: 11/394,970

(22) Filed: Mar. 31, 2006

(65) Prior Publication Data
US 2006/0219162 A1    Oct. 5, 2006

Related U.S. Application Data

(60) Provisional application No. 60/667,857, filed on Apr. 1, 2005.

(51) Int. Cl.
*C30B 25/12* (2006.01)
(52) U.S. Cl. .................. 117/95; 117/97; 427/133; 427/154; 427/372.2; 427/421.1; 427/428.1; 428/213
(58) Field of Classification Search .......... 117/208, 117/217; 427/133, 154, 372.2, 427.1, 428.01; 428/213
See application file for complete search history.

(56) References Cited

U.S. PATENT DOCUMENTS

| | | | |
|---|---|---|---|
| 4,323,545 A | 4/1982 | Sellers et al. |
| 5,431,869 A | 7/1995 | Kumar et al. |
| 6,083,625 A | 7/2000 | Fiel et al. |
| 6,165,425 A | 12/2000 | Lange et al. |
| 6,426,133 B1 | 7/2002 | Kondo et al. |
| 6,479,108 B2 | 11/2002 | Hariharan et al. |
| 6,491,971 B2 | 12/2002 | Costantini et al. |

OTHER PUBLICATIONS

"A Reusable Mold in Directional Solidification for Silicon Solar Cells", Solar Energy Materials, vol. 9, (1983), pp. 337-345, Saito, et al.*
PCT Search Report dated Aug. 11, 2007 of Patent Application No. PCT/US06/12017 filed Mar. 31, 2006.
* cited by examiner

*Primary Examiner*—Felisa C Hiteshew
(74) *Attorney, Agent, or Firm*—Vern Maine & Associates (57) ABSTRACT

A process for making silicon ingots using a multi-part, reusable, graphite crucible of at least two mold pieces configured for assembly into an open top mold having an interior surface functional as a mold cavity for receiving molten silicon; removing or reducing a prior applied release coating from the interior surface until a uniformly smooth finish is achieved; coating the interior surface with a first layer of release coating comprising silicon nitride; coating the interior surface with a second layer of release coat comprising silica suspended in water; coating the interior surface with a third layer of release coat comprising silicon nitride; curing the release coat on said crucible; casting a silicon ingot in the crucible; and then repeating the prior steps multiple times.

20 Claims, 9 Drawing Sheets

SOLIDIFICATION OF CRYSTALLINE SILICON FROM REUSABLE CRUCIBLE MOLDS

RELATED APPLICATIONS

This application claims the benefit of U.S. Provisional Application No. 60/667,857, filed Apr. 1, 2005. This application is herein incorporated in its entirety by reference.

FIELD OF INVENTION

The invention relates generally to producing crystalline silicon with improved material properties by a relatively inexpensive technique. In particular the present invention relates to the crystal growth of crystalline silicon from a reusable crucible for applications in the photovoltaic and semiconductor industries.

BACKGROUND OF INVENTION

This technology is applicable to the production of crystalline silicon for photovoltaic and semiconductor applications. Semiconductor silicon has become the most important and characteristic material of the technological age. Today there are no electronic devices that do not use crystalline silicon material. Silicon, being an elemental semiconductor, does not have any interdiffusion or stoichiometry related issues as in the case of expensive III-V or II-VI compound semiconductor materials. Currently the silicon single crystals for electronic device applications are produced mainly by the Czochralski (CZ) technique and the Float Zone (FZ) technique. Because of the cost of the single crystalline silicon substrate and low production rates, industries have shifted their direction towards multicrystalline silicon even though single crystalline silicon produced by the CZ and FZ techniques yield higher solar cell efficiencies. Multicrystalline silicon is mainly grown by directional solidification, the heat exchanger method, the Bridgman method, electromagnetic casting, and conventional casting. Even though the cell efficiency of the multicrystalline material is lower when compared to its single crystalline counterpart, the shift towards multicrystalline silicon is because of the ease of production and higher throughputs.

Both in the CZ technique and the directional solidification techniques, transparent or opaque quartz crucibles for one time use are widely used in silicon crystallization processes for the semiconductor and photovoltaic industries. However, they experience a variety of material interaction problems which affect the quality of the crystallized silicon and cause failures in crystal growth process runs.

To keep the cost of crystalline silicon devices, including photovoltaic and electronic devices low, the cost of the silicon substrate must be kept low. Hence it is necessary to find an inexpensive way for growing crystalline silicon crystal.

The present invention is a novel crystalline silicon manufacturing concept, using a reusable crucible, and is expected to change the conventional manufacturing process of silicon. The crystalline silicon material grown from a reused crucible has less oxygen and carbon, which dramatically improves the device performance.

The search for a cost effective and usable crucible material for the manufacturing of crystalline silicon is an active area of research. For the growth of crystalline silicon for photovoltaic (PV) applications, slip cast silica crucibles are widely used. This type of crucible collapses after use, requiring a new crucible for each run. For example, to grow a 240 kilogram multicrystalline silicon ingot, a 69×69 cm crucible is required at a present cost of about $900 (US). The cost of the crucible is a significant contributor to the total cost of the ingot production process.

In spite of the unique beneficial properties of quartz materials, there are a number of difficulties experienced in employing quartz crucibles when the temperature of the crucible is close to or exceeds the melting point of silicon. Some of them are:

1. Silicon, when it is molten or near-molten (i.e. solidifying from the melt), is extremely reactive to the materials used to contain it. At temperatures greater than about 1300° C., silicon begins to attack and corrode such materials, deriving impurities from the crucible.
2. The mechanical and electrical properties of silicon crystals are influenced by metallic and non-metallic impurities in the silicon. Oxygen atoms incorporated in the silicon during the crystal growth process is a significant factor. The majority of oxygen in a grown silicon crystal is atomically dissolved, and occupies the interstitial sites. Oxygen-related defects in silicon cause stacking faults, thermal donor generation and oxide precipitation. In typical crystal growth systems where the molten silicon is held in contact with fused quartz crucible, the latter is the main source for oxygen, and results in oxygen concentration in the order of $5 \times 10^{17}$ to $1 \times 10^{18}$ atoms/cm$^3$ in silicon. Interface reactions between molten silicon and the quartz container are important in controlling the oxygen incorporation, and thus the properties of the single crystal silicon.
3. Quartz crucibles tend to deform at high temperature because of the softness of vitreous silica at temperatures exceeding the melting point of silicon. For this reason, secondary containers such as graphite susceptors are usually used to support the fused quartz crucibles.
4. The quartz (SiO$_2$) crucible undergoes several pertinent reactions in the system (with molten silicon; with secondary graphite containment, etc.): Such reactions and Gibbs free energies computed from JANAF (Joint Army, Navy, Air Force) thermo chemical data (NIST (National Institute of Standards and Technology) Standard Reference Data Program) are:

$$SiO_2(s) + Si(s, l) = 2SiO(g) \qquad [1]$$
$\Delta G_T^0$, cal/reaction = 164,340 − (79.5 ∗ T)  (1000 − 1685K)
          a. = 148,500 − (70.0 ∗ T)  (1685 − 2000K)

$$SiO_2(s) + C(s) = SiO(g) + CO(g) \qquad [2]$$
$\Delta G_T^0$, cal/reaction = 162,250 − (80.6 ∗ T)  (1000 − 2000K)

$$SiO_2(s) + 3C(s) = SiC(s, \alpha, \beta) + 2CO(g) \qquad [3]$$
$\Delta G_T^0$, cal/reaction = 143,830 − (80.4 ∗ T)   (1000 − 2000K)

The CO gas generated reacts with molten Si by the reaction represented by the following formula, leaving carbon in the molten Si, which gets segregated in the solid Si ingot.

$$CO + Si(Molten) = SiO + C \qquad [4]$$

Carbon (C), typically in the order of 4 parts per million (ppm), is incorporated into the silicon ingot which is produced since the molten state of silicon is required to be maintained for a long period of time.

Silicon carbide may be formed in the silicon ingot, which deteriorates the wafer quality apart from making inclusions in the ingot posing problems during cutting processes.

At high temperatures, molten silicon reacts with quartz and during solidification the silicon and quartz adhere to each other. Consequently, due to the difference in the coefficient of thermal expansion, both the crucible and ingot crack when they cool down. Also, the difference in thermal expansion between the solidifying silicon ingot and the crucible induces stress into the portions of the ingot that are in contact with the crucible, thus creating dislocations and non-usable regions.

Solutions to the above adhesion problem encountered in directional solidification of polycrystalline silicon can be overcome by applying a protective coating layer on the inner walls of the quartz crucible. Various coatings, including oxides, nitrides, carbides of silicon and combinations thereof, have been reported. This thin layer of coating essentially acts as a release agent. Among the several materials used as the coating layer, silicon nitride is the most widely used.

Due to the non-wetting characteristics of the silicon melt combined with the above mentioned coatings, the silicon ingot could be grown free of cracks. The use of silicon nitride as a coating material is well reported in the literature. Saito et al. [Conf. Rec. of $15^{th}$ PV Spec. Conf.] reported the successful growth of polycrystalline silicon ingot by employing such a coating on the inner surface of a crucible. Several different processes have been proposed for the application of the silicon nitride layer.

A wet spray method is disclosed in the prior art in which a water-based suspension of silicon nitride with binder and defoamer is spray-painted on the inner surface of the quartz crucible. The wet release coating is heated in a kiln to remove the binder. The finished coating possesses sufficient strength to maintain coating integrity during loading of the polysilicon and manipulation of the crucible into the growth furnace.

Other prior art describes the usage of silicon nitride on a silica crucible. There is also prior art that describes a silicon nitride coating process on a silica crucible. Another piece of prior art discloses a CVD coated silicon carbide for growing silicon crystals by a pulling process. Yet other prior art demonstrates the usage of hard coating of zirconates for silicon crystallization.

The use of silicon nitride coating alone has deleterious effects since the layer itself will decompose at higher temperatures, thus introducing nitrogen into the silicon melt. Secondly, since the coating is so porous it will allow the silicon melt to come in contact with the crucible walls, which are made out of silica, thereby drawing impurities from the crucible wall. In using a silica crucible, oxygen is introduced into the silicon melt by the reaction of silicon with the silica surface. Too much oxygen is not encouraged for the production of solar cells, while oxygen is needed for the fabrication of integrated devices.

Rudiger et al. (J. Electrochem. Soc. Vol. 142, 1995) have reported on the reaction of molten silicon with silicon nitride and other refractory materials. The studies clearly show that when silicon is melted in silicon nitride-coated crucibles, the silicon melt does not wet the silicon nitride for the first 20 minutes. At longer reaction times, the melt creeps through the silicon nitride coating.

Though silicon nitride and silicon oxynitride are used as coatings in large scale as crystal growth processes, as claimed by Prakash et al. (J. Cryst. Growth 144 (1994) 41), these coatings alone are not effective to achieve chemical purities for device application. The search for new coating technologies continues to receive significant attention. In order to prevent the silicon melt from coming in direct contact with the silicon nitride, researchers have also reported the use of molten salts with non-wetting characteristics.

The use of graphite as an alternative to quartz was widely attempted. Ciszek et al. in their article in IBM J. Res. Dev. have illustrated a process of growing solar grade silicon by directional solidification in carbon crucibles. Here, the graphite crucible is a sacrificial crucible, i.e. one crucible yields one run, because of the adhesion of the silicon to the crucible walls. A Ukrainian research group has also demonstrated a carbon-carbon crucible for silicon solidification.

Saito et al. (Solar Energy Materials, Vol. 9, 1983) developed a SiC coated carbon or sintered silicon nitride reusable mold with a coating of silicon nitride as the mold release agent. A CVD coated silicon carbide on a graphite mold in combination with silicon nitride coating as mold release for growing silicon crystals is also described in the prior art.

Though the above processes are suited to produce crystalline silicon, the crucible cost is more expensive than the quartz crucible.

To get rid of the impurity incorporation from the quartz crucible and to save cost on the crucible material the present invention is directed towards a process of growing crystalline silicon from non-quartz and reusable crucibles.

SUMMARY OF INVENTION

It is an object of the invention is to provide a low cost, reusable, thermal expansion matched, multi-piece crucible.

Another object of the invention to provide a cost reduction measure for the production of high purity crystalline silicon ingots by use of a reusable crucible technology that can be configured to grow vertically cylindrical ingots, square ingots, pseudo square (rounded corners) ingots, or other various and desirable cross sections and geometries to produce the silicon ingots and therefrom the silicon wafers required by electronic and photovoltaic device manufacturers.

Yet another object of the invention is to provide a multi-layered release coating process for coating a reusable crucible or its component parts in which the coating can be reapplied each time the crucible is used, thereby extending the useful life of the crucible.

Still other objects of the present invention will become readily apparent to those skilled in the art from the following detailed description wherein only the preferred embodiment of the invention is described by way of illustration of the best mode contemplated for carrying out the invention. It should be noted that the language used in the specification has been principally selected for readability and instructional purposes, and not to limit the scope of the inventive subject matter. The invention is capable of other and different embodiments and its details are capable of modification in various respects without departing from the invention.

DESCRIPTION OF THE PREFERRED EMBODIMENT

A cost reduction measure for the production of high purity crystalline silicon ingots by the use of a reusable crucible having a novel coating is described herein. The best mode and other embodiments illustrated and described should be interpreted as illustrative, but not limiting, of the scope of the invention.

While reusable molds may be well known in other arts, a study of this art makes it very apparent that the accepted wisdom and current technology assumes as fact that reusable crucibles are simply unworkable for this purpose, in spite of the obvious motivation of needing to lower costs. To oppose this accepted body of knowledge and practice, the approach taken was to explore, research, invent, test, and confirm the unexpected, namely that a reusable crucible and recoating process is both possible and practical.

First, a low cost, reusable, thermal expansion matched, multi-piece crucible was developed. Generally, circular shaped wafer geometry is preferred by the electronic device manufacturers, unlike the photovoltaic industry which prefers to use a square shaped wafer geometry. The reusable crucible with multi-layered release coating of the present invention can be formed to grow vertically cylindrical ingots, square ingots, pseudo square (rounded corners) ingots, or other various and desirable cross sections and geometries to produce wafers required by the electronic and photovoltaic device manufacturers.

Figure 1:
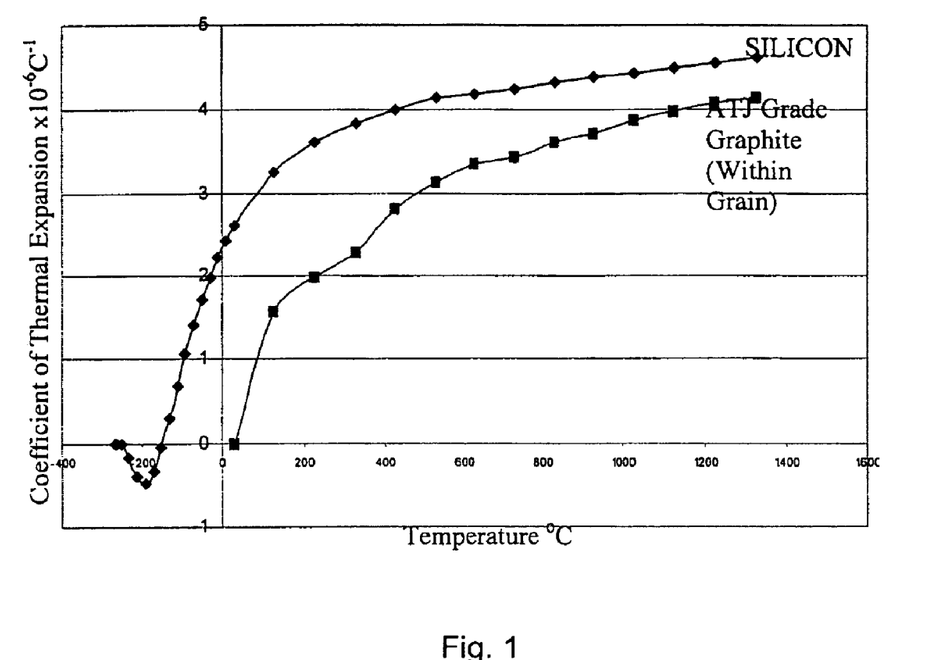
FIG. 1 is a graph of the coefficient of thermal expansion versus temperature for silicon and ATJ grade graphite (within grain).

The reusable crucible concept and invention which is described in this patent requires a selection of a suitable material of graphite whose coefficient of thermal expansion (CTE) is less than that of silicon, as seen in the graph of FIG. 1. During the cooling phase the silicon contracts more than the crucible and away from the crucible wall, ensuring that the crucible releases the silicon ingot as it solidifies.

FIGS. 2-9 illustrate multiple aspects and embodiments of a reusable, multi-part crucible according to the invention.

As seen in FIGS. 2-9, the multi-piece mold is made from thermal expansion matched graphite, meaning that all pieces of the mold have the same CTE, with an oriented grain structure, and preferably have a uniform wall or piece thickness that is within a range of about 0.5 to 2 inches. A tapered or non-uniform wall thickness is within the scope of the invention and may be desirable in some embodiments to accommodate particular mold cavity shapes that do not conform to or match the required external mold shapes or mold assembly techniques. Particular external mold shapes may be dictated by transport systems or furnace designs with which the mold is associated.

The central axis of the crucible is preferably oriented substantially perpendicular to the orientation of the graphite grains of the component pieces of the mold, although there may be embodiments where alternative orientations of the grain to axis are useful. Some other graphite types (with different grain directions) may be manufactured with CTE (coefficient of thermal expansion) less than or equal to silicon. ATJ grade graphite with perpendicular grain direction is preferred in terms of CTE.

In the case of ATJ grade graphite, only in the perpendicular direction, the CTE is less than that of silicon. While no material has a coefficient of expansion exactly matching silicon, the preference is for materials having the strength and/or preferential expansion properties that can be suitably matched to the silicon, keeping the grain direction of the material in mind. For example, points of stress could be emphasized in the connection if graphite bolts or studs are used. In these areas the grains should be oriented such that the larger expansion is perpendicular to the length of the center axis of the bolt or stud.

The abutting or connecting edge joints of adjacent pieces may be simple face to face or right angle joints, such as lap joints or square butt joints, or they may be V-joints, tongue and groove joints, sliding slot joints or dovetail joints or other known or new joining geometries for interconnecting panels, pieces or parts. A variety of fasteners may be employed to make or secure the joint. In other embodiments, the selected joint geometry of all or some joints in the mold may not require the use of fasteners. Bands made out of graphite or molybdenum may be used to hold the molds together. The bands may be hoops or belts or straps and may be fastened or connected to the crucible by molybdenum or graphite fasteners such as bolts, nuts, clips, pins or the like.

Joint tightness is not a serious concern as the coating on the inside of the mold may mask the joints or have been applied over the joint surfaces prior to assembly. The coating has a total non-wetting characteristic with the silicon melt. Hence, the coating prevents leaking or contact with the graphite by the molten silicon.

There are many variations of a multi-piece mold according to the present invention.

Figure 2:
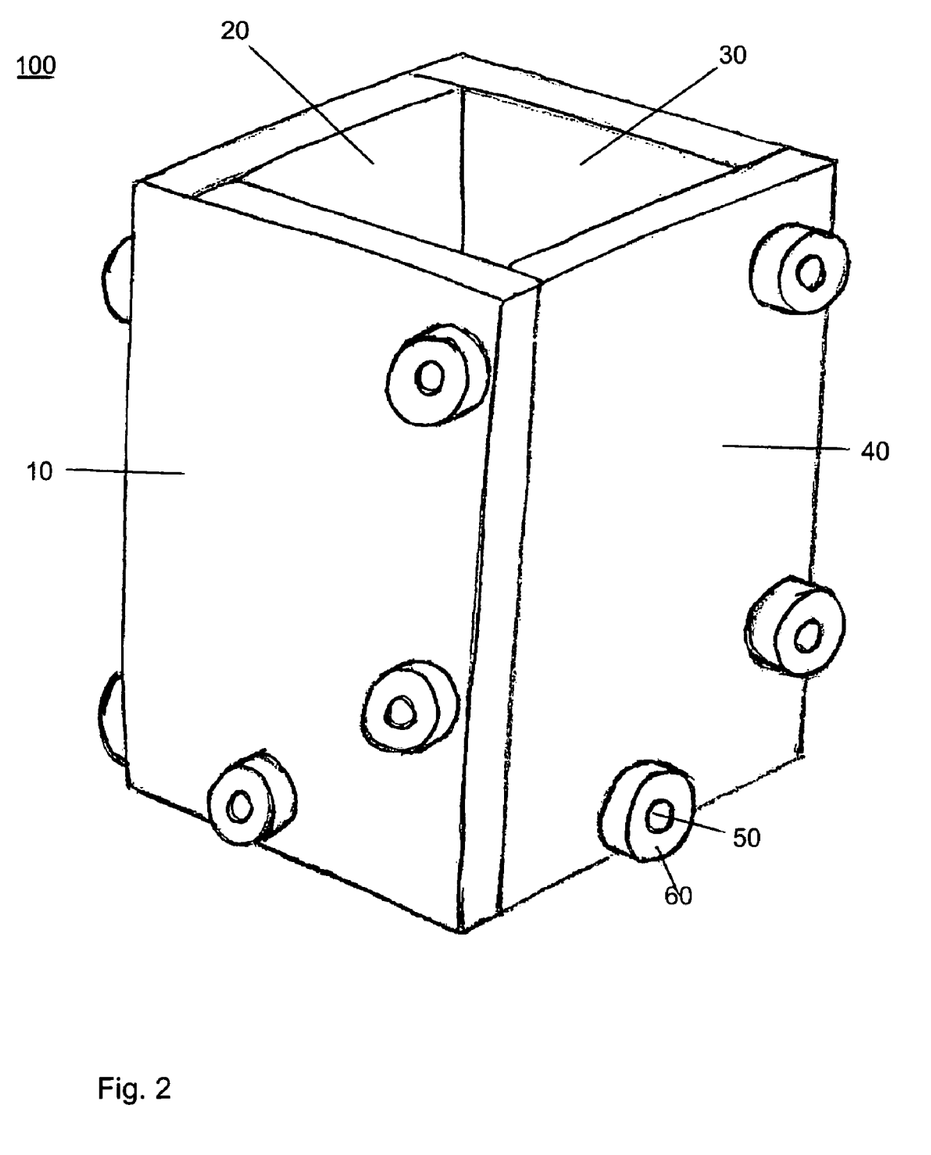
FIG. 2 is a perspective view of a multi-part, reusable, open top, square, graphite crucible shown assembled and secured with threaded studs and circular nuts configured in accordance with one embodiment of the present invention.

Referring to FIG. 2, one embodiment consists of a reusable mold 100 that has a bottom piece (not shown) and four side pieces 110, 120, 130, 140 held together by threaded studs 150 and nuts 160. Studs 150 and nuts 160 may or may not be reusable. Studs 150 and nuts 160 are preferably made from carbon or carbon laminates and are reusable. Finger tightening of nuts 160 is sufficient for mold integrity during use in most cases.

Figure 3:
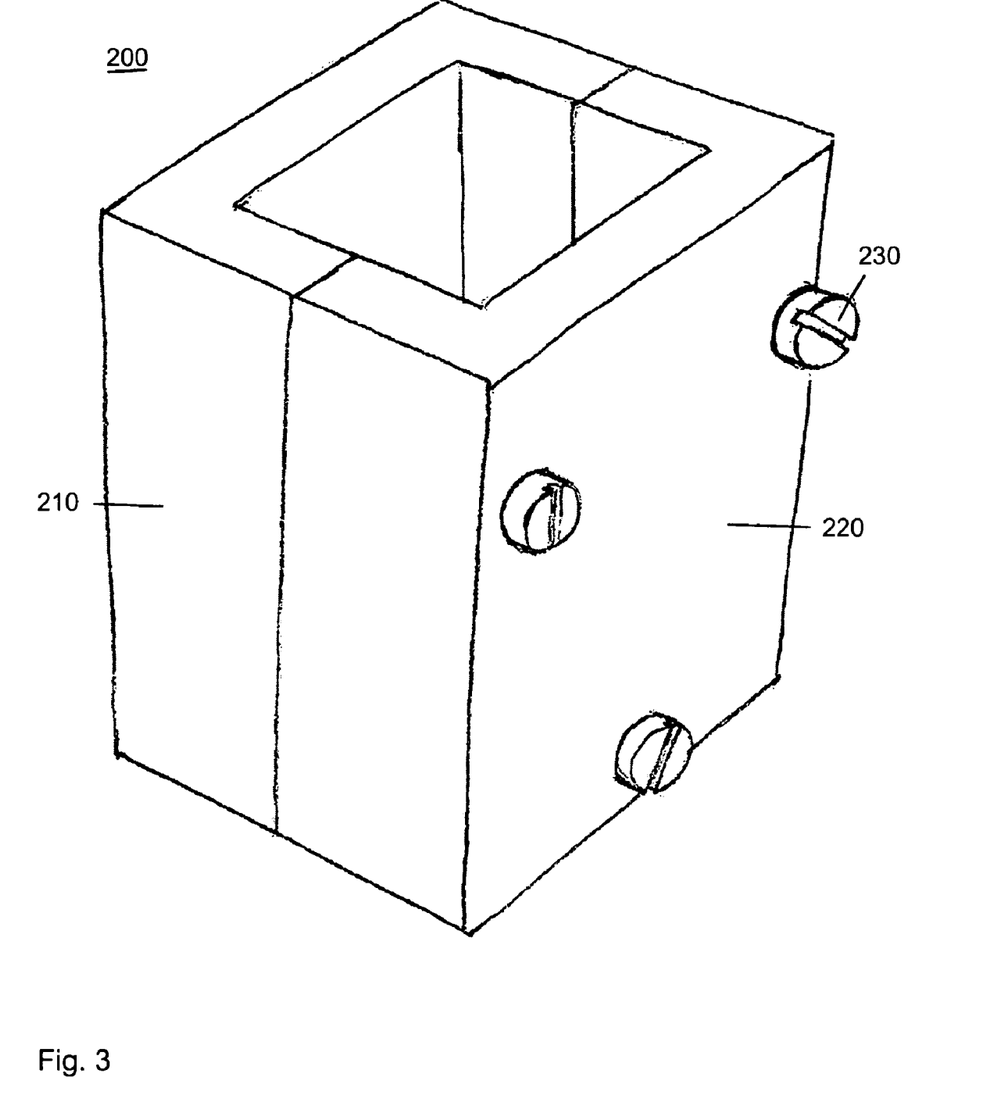
FIG. 3 is a perspective view of a two part, reusable, square, graphite crucible assembled with three screws configured in accordance with another embodiment of the present invention.

Referring to FIG. 3, another embodiment consists of a reusable, two piece mold 200 for producing ingots of a square cross section or shape. Since the force required to hold the mold-halves 210, 220 together is minimal, simple graphite screws 230 may be used and reused many times.

Figure 4:
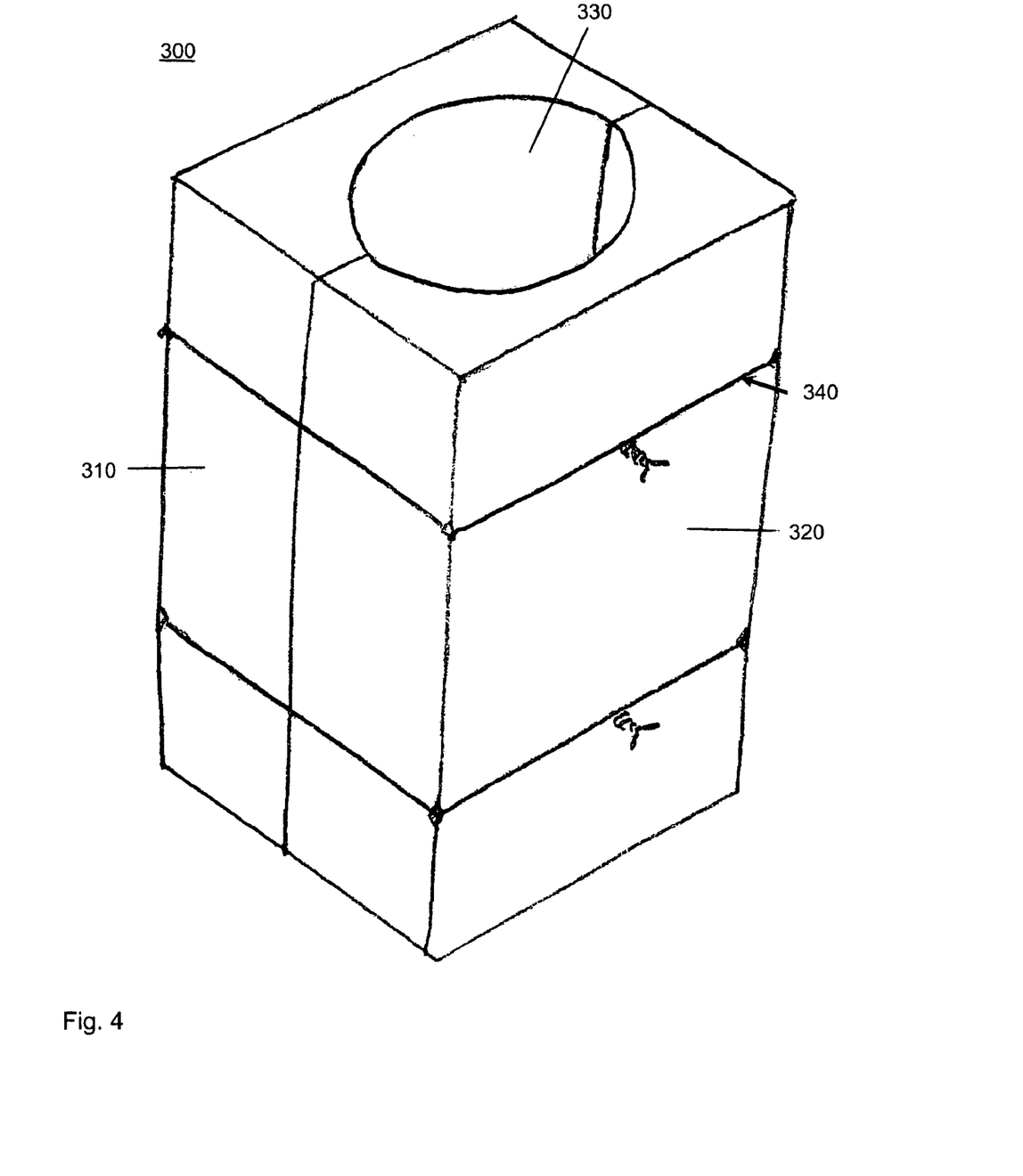
FIG. 4 is a perspective view of a multi-part, reusable, circular, graphite crucible with a square exterior, assembled with aligning pins (not shown) inserted into matching holes (not shown) in the abutting faces of the joints, and secured with high temperature wire configured in accordance with a further embodiment of the present invention.

Referring to FIG. 4, a further embodiment consists of a reusable, two piece mold 300 for producing ingots of round or pseudo square shape where the mold 300 may have a nominally square outside geometry but have a round or pseudo square inside shape or mold cavity 330 with the mold pieces 310, 320 being held in their assembled relationship by moly wire ties 340 or graphite screws (not shown).

Figure 5:
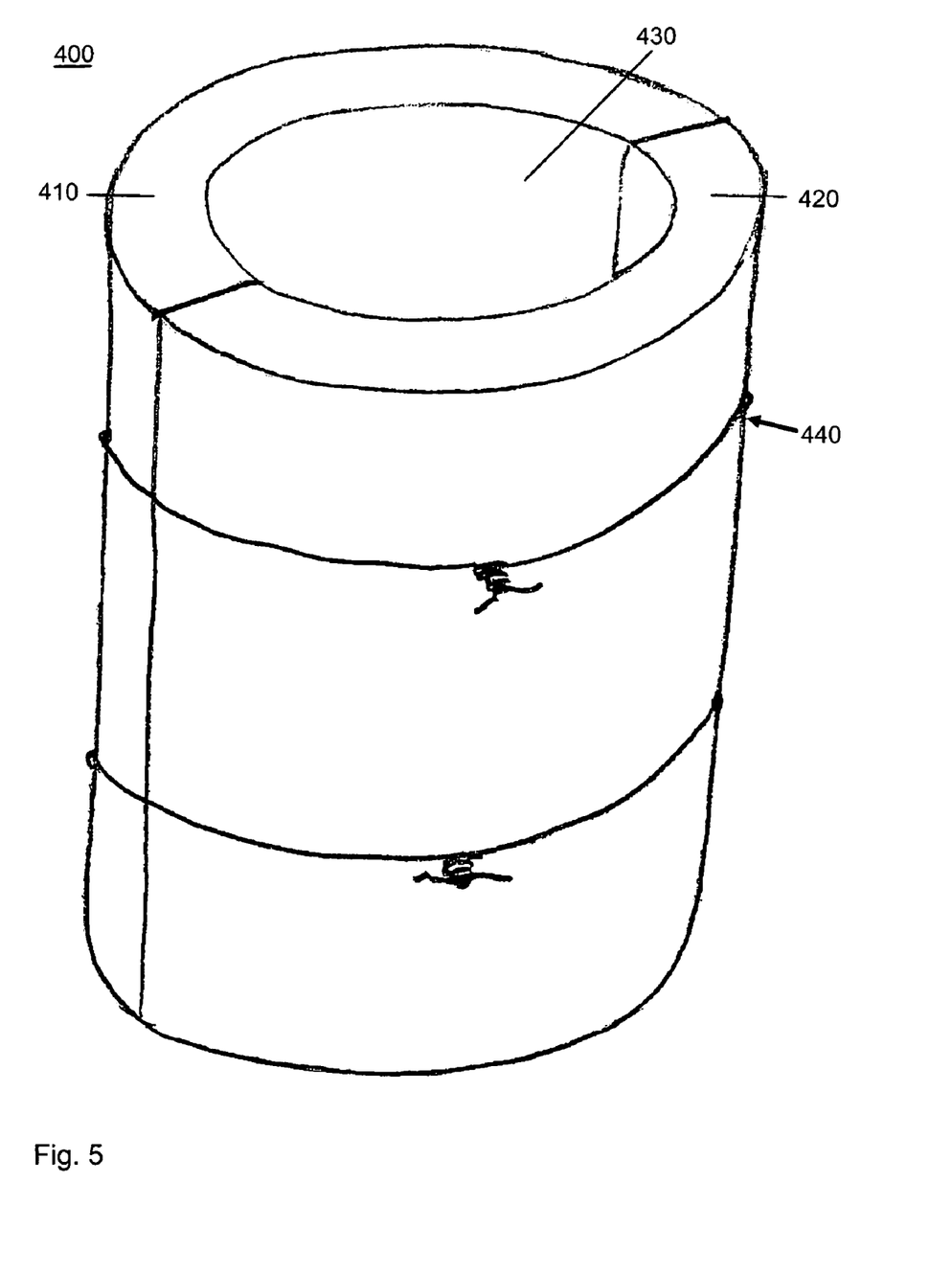
FIG. 5 is a perspective view of a multi-part, reusable, circular, graphite crucible of uniform wall thickness assembled and secured with high temperature wire configured in accordance with an embodiment of the present invention.

Referring to FIG. 5, an additional embodiment consists of a reusable, two piece mold 400 of uniform wall thickness for producing cylindrical ingots with a round mold cavity 430 inside and a round outside geometry.

Figure 6:
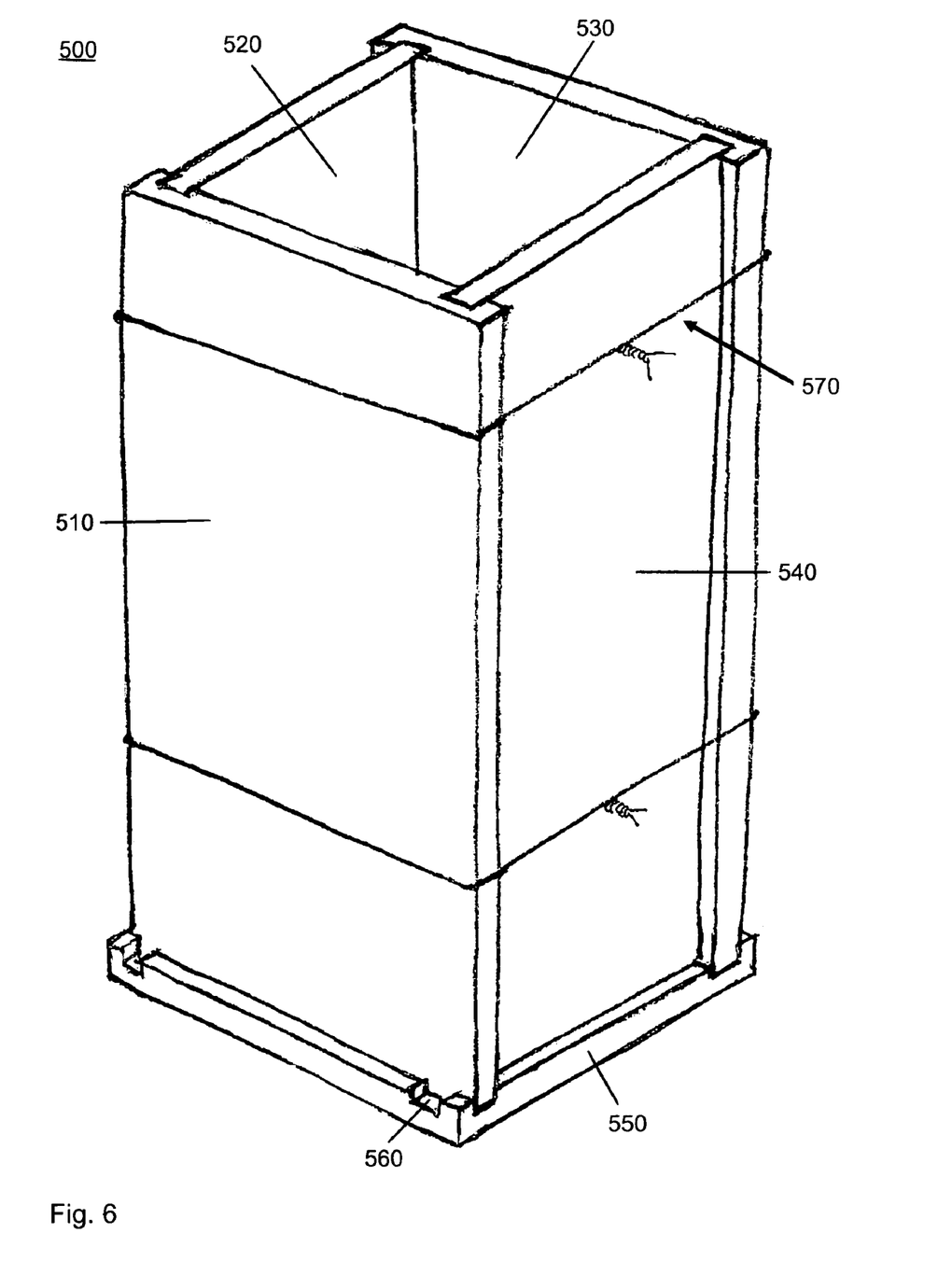
FIG. 6 is a perspective view of a multi-part, reusable, square, open top, graphite crucible of uniform wall thickness, selected parts of which are grooved along at least one side of one surface for accepting the edge of an adjacent panel as a right angle joint, the assembled crucible being secured by high temperature wire ties configured in accordance with another embodiment of the present invention.

Referring to FIG. 6, another embodiment consists of a reusable, five piece mold consisting of 4 wall pieces 510, 520, 530, 540 and a bottom piece 550, with interlocking grooves 560 on the abutting edges of the pieces. Moly wire tie wraps 570 may be used to keep the interlocked side pieces engaged. Since the moly wire is annealed it remains soft after casting.

A reusable, multi-piece mold in any of the above or other shapes and joint geometries, using these or other assembly methods of the multi piece molds which may include the use of sliding slot joints, shiplap or scarf joints, hinge pin joints, with or without use of the same or other types of fasteners such as pins, hinge pins, wedges, and U clips, whether used exclusively or in combination, such as round tapered moly pins or tapered wedges alone or with bolts and nuts or wire ties.

Figure 7:
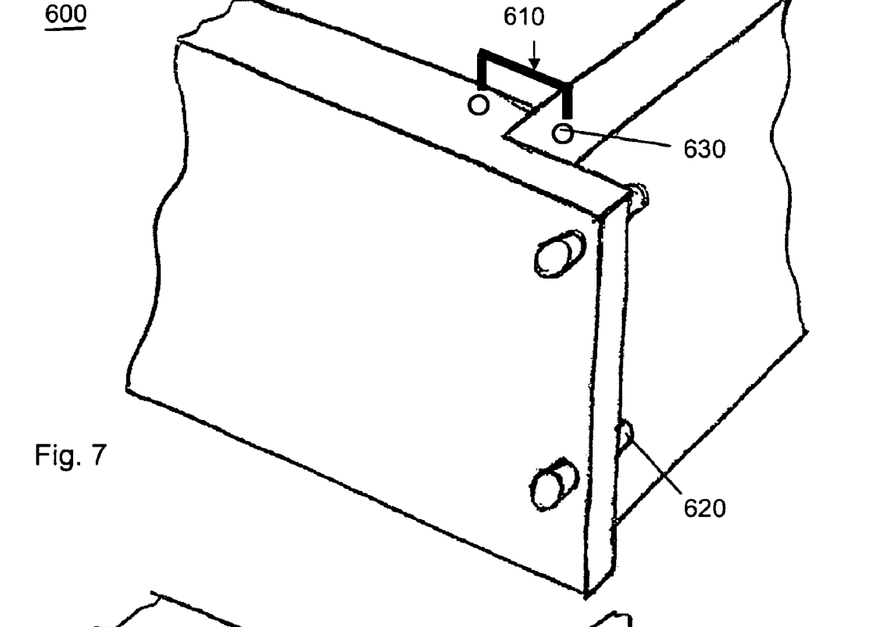
FIG. 7 is a partial perspective view of a multi-part, reusable crucible, illustrating a corner joint and the use of pins, holes and U clips for securing the joint configured in accordance with a further embodiment of the present invention.
Figure 8:
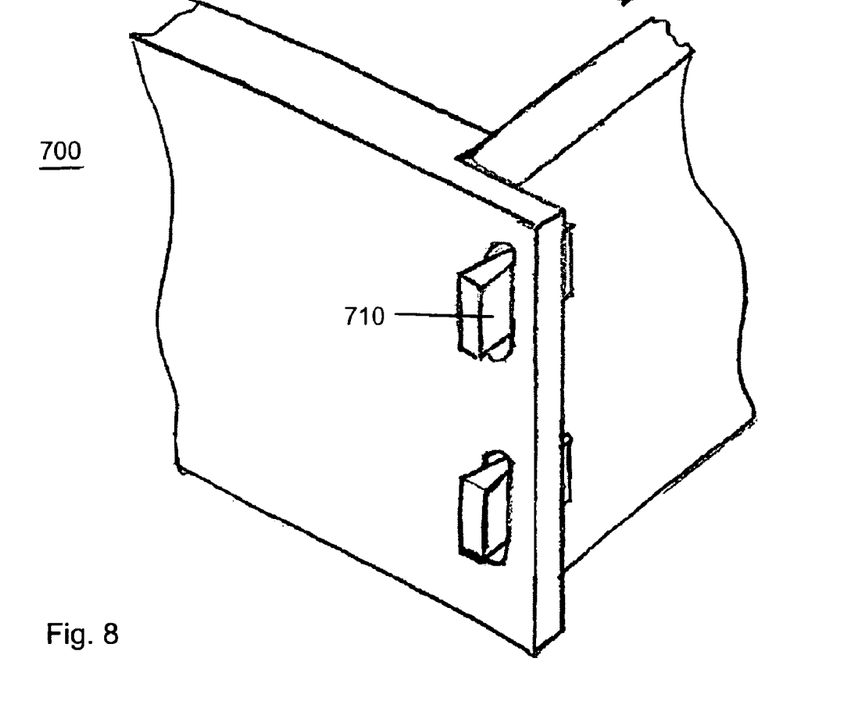
FIG. 8 is a partial perspective view of a multi-part, reusable crucible, illustrating a corner joint and the use of wedges or tapered pins and holes for securing the joint configured in accordance with an embodiment of the present invention.

FIG. 7 shows a corner joint 600 of such a mold using a tungsten U-clip 610 and pins 620 inserted into holes 630 for edge interconnection, while FIG. 8 shows a corner joint 700 using a tapered wedge 710.

Figure 9:
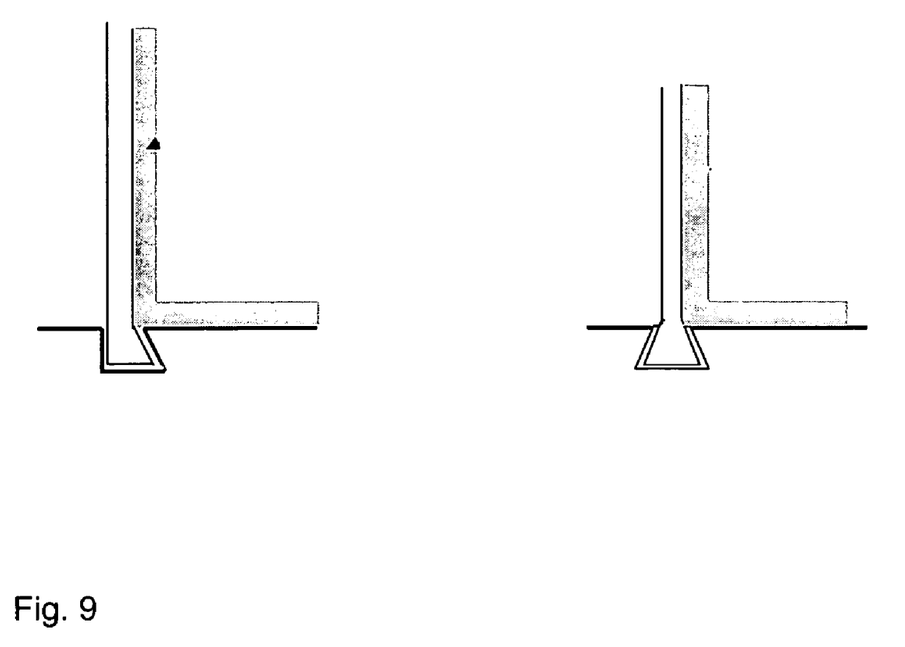
FIG. 9 is a diagram illustrating a dovetail joint design that allows for reversing the panel face upon reassembly of the crucible according to one aspect of the invention.

As seen in FIG. 9, the design and geometry of at least some of the individual pieces of the crucible preferably provide for a reversing of these pieces during each reassembly so that both sides of the piece are used alternately for the cavity side or inside surface of the mold or crucible. Among the reasons for this feature, not required or compatible with all embodiments, is that it compensates for or balances out any bowing or deforming effect that occurs in a flat wall or piece between supporting joints or corners of the mold, due to exposure to silicon vapor.

As explained above, a coating is required to isolate the silicon melt and release the silicon ingot from the graphite crucible. Applying the release coating involves a multi-step, multi-layer process. It should be noted that for repetitive use, scrubbing of the plates to remove any old coating material adhering to the plates may be required on previously used molds before the coating process is conducted again. One application method is a three layer process and may include the following layers, steps and conditions:

The first layer is a silicon nitride layer applied to at least those surfaces of the mold pieces or assembled mold that comprise the mold cavity; the inside surfaces of the mold. The coating is preferably applied by spraying, although other techniques such as squeegee coating or roller coating may with some routine experimentation be used.

For the spraying step, the silicon nitride material is dispersed in an aqueous media or a non-aqueous media, such as alcohol or glycol-based media, with or without binders such as solid or liquid binders including cellulose ether, paraffin, acetone, polymers of propylene oxide, poly vinyl alcohol and others. The surfaces to be coated should have a fine finish that is smooth to the eye and hand.

A second layer consisting of silica suspended in water of different proportions, for example, 1:10 silica to water, with or without surfactants or binders. Other proportion ranges from 1:4 to 1:90 are within the scope of the invention.

A third layer is a second application of silicon nitride coating, the silicon nitride suspension prepared by dispersing silicon nitride in aqueous or non-aqueous media, with or without binders.

A brief drying time for each layer is required before the application of a subsequent layer. Depending on the size of the mold, for example for a 69×69 cm mold, each coating layer is preferably given about 15 minutes drying time. The coating process may be applied to the pieces of the mold prior to assembly of the mold, or at least to the mold cavity surface or walls. The coating process may include a preliminary coating of mold components prior to assembly followed by a post-assembly coating of the mold or at least the mold cavity.

A three-layer process is described, but fewer than three layers of coating may be used. Two or even one layer of a silicon nitride coating to the mold cavity is within the scope of the invention, but with proportionally less assurance of satisfactory performance. More than the preferred three layers may also be used, however crucible preparation will become more complex, and adhesion between layers becomes proportionally more of an issue. A two to four layer process is preferred, and a three layer process is most preferred.

The final full, green (before baking or curing) coating thickness is preferably in the range of 75-1500 microns, although a greater or lesser final coating thickness is within the scope of the invention. The final coating is inspected visually for cracks, blisters or other visible defects prior to curing.

The spraying is preferably carried out by a composite spray gun/ultrasonic spraying, by a robotic arm or manually, while the crucible plates or pieces are maintained at an elevated temperature within a preferred range of 50-200° C., depending on the spray solution, in a heated spray booth or conveyor station. For example, a preferred temperature for an aqueous-based solution coating is less than 90° C.; for a glycol-based solution coating, less than 125° C.; for an alcohol-based solution coating, less than 60° C. If the temperature is excessive for the boiling point of the solution, then sudden vaporization of the suspension media can adversely affect the coating adhesion.

Figure 10:
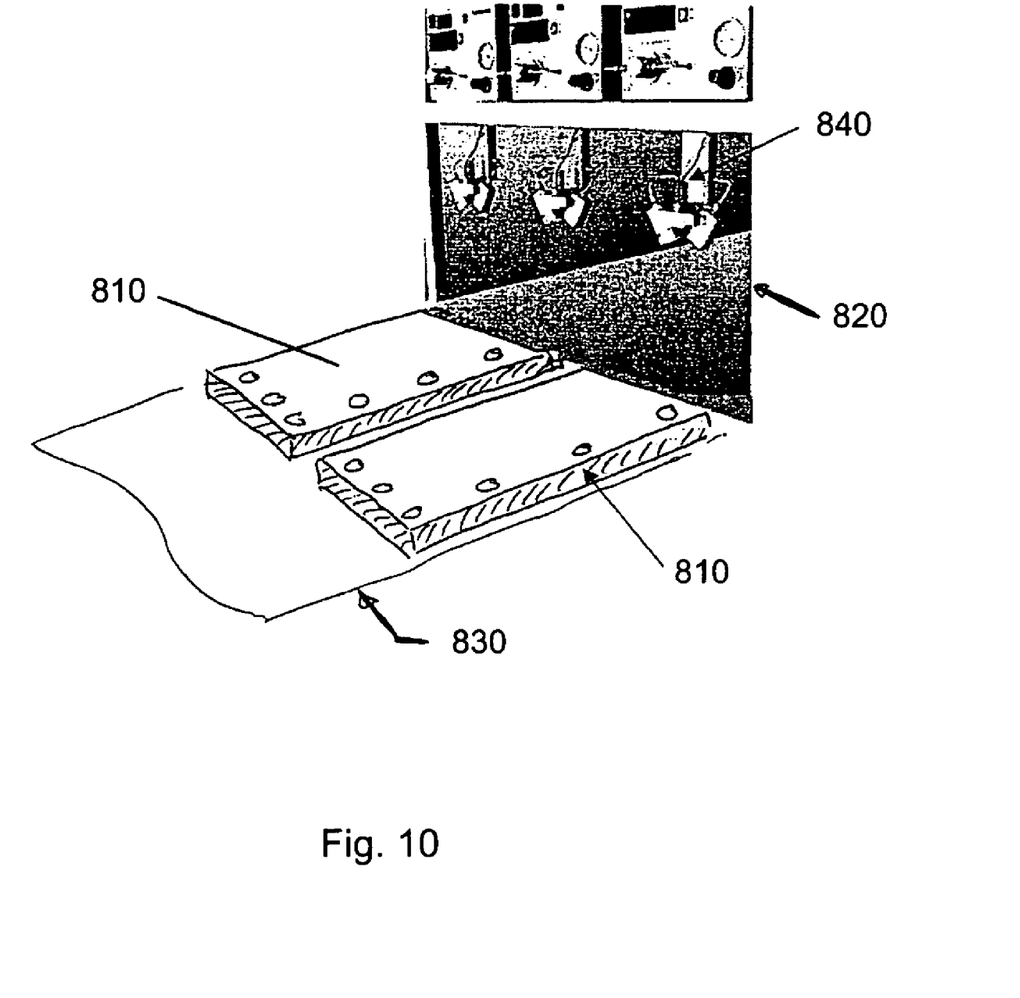
FIG. 10 is a diagrammatic illustration of a conveyor fed, spray coating chamber for applying layers of release coating to the panels of the reusable crucible according to another aspect of the invention.

As illustrated in the embodiment of FIG. 10, individual mold pieces, namely the graphite plates of the crucible 810, can be moved through a coating chamber 820 on a conveyor assembly 830 with a heated base or other means for keeping the pieces hot. The ultrasonic spray head 840 consisting of multiple nozzles arranged to cover the whole plate area with air knifes arranged to precisely control coating thickness disperses the coating onto the graphite pieces or plates.

In the case of fully assembled molds the crucible is preferably held in a heated spray booth while a multi-axis robotic arm moves inside the crucible with a spray gun nozzle or ultrasonic spray system to disperse the coating onto the inside surface or cavity wall of the assembled mold. The motion of the robotic arm can be programmed to produce a uniform coating pattern and thickness. Alternatively, a mold can be moved by a robotic arm around and about a stationary spray head, or relative motion by the spray head and the mold can be provided, all to the same end of coating at least the mold cavity.

The coated crucible is then baked or cured in air at an elevated temperature of not more than 600° C. for about 3-15 hours, or alternatively in an inert gas which may be any of Ar, He, or $N_2$, but is commonly Ar and $N_2$, at slightly above ambient pressure or flowing gas pressure and where the temperature may be elevated to within the 600-1500° C. range, for about 10 hours. The purpose of the baking or curing step is to remove the binder from the coating and promote sintering of the coating layer.

The silicon nitride powder in the coating preferably consists of crystalline phase $\beta/(\alpha+\beta)<5$ wt %, and high purity. The fine grain silica powder is preferably of very high purity, for example as much or more than 99.9% pure.

The binder is preferably organic, such as, but not limited to, cellulose ether, paraffin, acetone, polymers of propylene oxide, poly vinyl alcohol, or inorganic, such as boric acid, with low temperature weight loss, so that the binder gets burnt out cleanly and predictably during the curing process without introducing any impurities.

The crystallization of silicon in one example of use of the above described reusable coated crucible was carried by directional solidification. During the solidification process, the heat-up cycle was carried out under vacuum up to 1200° C. and after that in a mixture of Ar+5–10% of $N_2$. The purpose of the $N_2$ is to prevent the decomposition of the final layer of coating above the melt surface. Also the reusable crucible drastically reduced the oxygen concentration in the crystal and resulted in a solar cell efficiency in the order of 17% as opposed to the contemporary efficiencies of about 14-15% with conventional silicon wafers.

Ingots of several sizes were grown using the above technology of multilayered protective coatings on reusable crucibles. The size of the crucible is scalable to grow ingots ranging from less than 500 grams to more than 2000 kilograms as well as ingots ranging between 500 grams and 2000 kilograms. The crucible plates were cycled for several runs ranging from 10 to 15 times and remain usable. After each run, the mold was disassembled, inspected, the coating was reapplied, and the mold reassembled to produce high quality ingots. The grown ingots were characterized for their electrical, structural and device properties and compared favorably to the product of prior art technologies.

Other and numerous embodiments of the methods and devices equivalent to those described and claimed are within the scope of the invention.

What is claimed is:

1. A coating process for applying a multi-layer release coat to an interior surface of a reusable crucible for producing silicon ingots comprising:
   removing any prior applied release coating from the interior surface until a uniformly smooth finish is achieved;
   applying at least a first layer of a release coating of silicon nitride to the interior surface;
   applying a second layer of a release coating of silica suspended in water to the interior surface;
   applying a third layer of release coating of silicon nitride to the interior surface wherein the final full release coating has a thickness of 75 to 1500 microns; and
   curing the release coating onto the crucible.

2. The coating process of claim 1 wherein the release coating is applied by a method selected from the group consisting of spraying, squeegee coating, roller coating, and a combination thereof.

3. The coating process of claim 1 wherein the first and third layers of the release coating of silicon nitride are dispersed in an aqueous media.

4. The coating process of claim 3 wherein the aqueous media contains a binder selected from the group consisting of cellulose ether, paraffin, acetone, polymers of propylene oxide, poly vinyl alcohol, and a combination thereof.

5. The coating process of claim 1 wherein the first and third layers of the release coating of silicon nitride are dispersed in a non-aqueous media.

6. The coating process of claim 5 wherein the non-aqueous media contains a binder selected from the group consisting of cellulose ether, paraffin, acetone, polymers of propylene oxide, poly vinyl alcohol, and a combination thereof.

7. The coating process of claim 1 wherein the silica suspended in water contains a surfactant.

8. The coating process of claim 1 wherein the silica suspended in water contains a binder.

9. The coating process of claim 1 further comprising drying of each of the release coating layers prior to application of a subsequent release coating layer.

10. The coating process of claim 1 further comprising maintaining the crucible at a temperature of 50° to 200° C.

11. The coating process of claim 1 further comprising curing the crucible in air at an elevated temperature for a period of time.

12. The coating process of claim 11 wherein the elevated temperature is not more than 600° C.

13. The coating process of claim 11 wherein the period of time is at least 3 to 15 hours.

14. The coating process of claim 1 further comprising curing the crucible in an inert gas at slightly above ambient pressure or flowing gas pressure.

15. The coating process of claim 14 wherein the inert gas is selected from the group consisting of Ar, He, $N_2$, and a combination thereof.

16. The coating process of claim 14 further comprising curing the crucible at an elevated temperature for a period of time.

17. The coating process of claim 16 wherein the elevated temperature is between 600-1500° C.

18. The coating process of claim 16 wherein the period of time is about 10 hours.

19. A process for making a silicon ingot, comprising:
    using a reusable crucible having an interior surface that functions as a mold cavity for receiving molten silicon;
    removing any prior applied release coating from the interior surface until a uniformly smooth finish is achieved;
    coating at least the interior surface with a release coating comprising silicon nitride, said step of coating comprising:
      applying at least a first layer of a release coating of silicon nitride to the interior surface;
      applying a second layer of a release coating of silica suspended in water to the interior surface;
      applying a third layer of release coating of silicon nitride to the interior surface wherein the final full release coating has a thickness of 75 to 1500 microns;
    curing the release coating onto the crucible;
    receiving the molten silicon into the cavity of the reusable crucible;
    casting a silicon ingot in the crucible; and
    repeating the prior steps at least once.

20. A process for making a silicon ingot using directional solidification comprising:
    using a reusable crucible having an interior surface that functions as a cavity for receiving silicon for melting;
    removing any prior applied release coating from the interior surface until a uniformly smooth finish is achieved;
    coating at least the interior surface with a release coating comprising silicon nitride, said step of coating comprising:
      applying at least a first layer of a release coating of silicon nitride to the interior surface;
      applying a second layer of a release coating of silica suspended in water to the interior surface;
      applying a third layer of release coating of silicon nitride to the interior surface wherein the final full release coating has a thickness of 75 to 1500 microns;
    loading the silicon for melting into the cavity of reusable crucible;

conducting a heat-up cycle under vacuum until attaining a temperature of at least 1200° C.;

introducing a mixture comprising Ar and $N_2$, wherein the $N_2$ comprises between 5 and 10% of the mixture; and continuing the melting and directional solidification process until growth of the silicon ingot is completed.

* * * * *